(12) United States Patent
Liu (10) Patent No.: US 6,788,727 B2
(45) Date of Patent: Sep. 7, 2004

(54) METHOD AND APPARATUS FOR TUNABLE WAVELENGTH CONVERSION USING A BRAGG GRATING AND A LASER IN A SEMICONDUCTOR SUBSTRATE

(75) Inventor: Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 132 days.

(21) Appl. No.: 10/171,731

(22) Filed: Jun. 13, 2002

(65) Prior Publication Data

US 2003/0231686 A1 Dec. 18, 2003

(51) Int. Cl.[7] .............................................. H01S 3/08
(52) U.S. Cl. ....................................................... 372/102
(58) Field of Search .................................. 372/102, 92

(56) References Cited

U.S. PATENT DOCUMENTS

| | | | | | |
|---|---|---|---|---|---|
| 5,253,314 | A | * | 10/1993 | Alferness et al. | 385/40 |
| 5,379,318 | A | * | 1/1995 | Weber | 372/96 |
| 5,499,256 | A | * | 3/1996 | Bischel et al. | 372/28 |
| 5,509,025 | A | * | 4/1996 | Capasso et al. | 372/45 |
| 5,511,083 | A | * | 4/1996 | D'Amato et al. | 372/6 |
| 6,014,480 | A | * | 1/2000 | Baney | 385/24 |
| 6,055,254 | A | * | 4/2000 | Capasso et al. | 372/45 |
| 6,101,210 | A | * | 8/2000 | Bestwick et al. | 372/96 |
| 6,438,277 | B1 | * | 8/2002 | Eggleton et al. | 385/1 |
| 6,470,036 | B1 | * | 10/2002 | Bailey et al. | 372/20 |
| 6,510,167 | B1 | * | 1/2003 | Jain et al. | 372/6 |
| 6,527,398 | B1 | * | 3/2003 | Fetzer | 356/437 |
| 6,628,450 | B2 | * | 9/2003 | Samara-Rubio | 359/279 |
| 2002/0197013 | A1 | * | 12/2002 | Liu et al. | 385/37 |
| 2003/0031438 | A1 | * | 2/2003 | Kambe et al. | 385/122 |
| 2003/0086155 | A1 | * | 5/2003 | Ovadia et al. | 359/344 |
| 2003/0161570 | A1 | * | 8/2003 | Paniccia | 385/14 |

FOREIGN PATENT DOCUMENTS

| | | |
|---|---|---|
| JP | 09102643 | 4/1997 |
| WO | WO 02/13344 A1 | 2/2002 |
| WO | PCT US03/15420 | 10/2003 |

OTHER PUBLICATIONS

Mikkelsen, B., "Penalty Free Wavelength Conversion of 2.5 Gbit/s Signals Using A Tuneable DBR–laser," Proceedings of the European Conference on Optical Communciation (ECOC) Regular Papers, Berlin, (Sep. 27–Oct. 1, 1992), vol. 1, Conf. 18, 1992, pp. 441–444.

Braagaard, C., et al., "Modeling the DBR Laser Used As A Wavelength Conversion Device," Journal of Lightwave Technology, IEEE, vol. 1, No. 6, (Jun. 1, 1994), pp. 943–951.

Gurib, S., et al., "Antireflection Coated Distributed Bragg Reflector Laser For All Optical Wavelength Conversion With Wavelength Insensitivity and Extinction Ratio Enhancement Capability," Proceedings of the European Conference on Optical Communication (ECOC) Firenze, (Sep. 25–29, 1984), vol. 2, Conf. 20, pp. 651–654.

(List continued on next page.)

*Primary Examiner*—Don Wong
*Assistant Examiner*—Phillip Nguyen
(74) *Attorney, Agent, or Firm*—Blakely, Sokoloff, Taylor & Zafman LLP (57) ABSTRACT

Embodiments of a method and apparatus for tunable wavelength conversion using a Bragg grating and a gain medium disposed in a semiconductor substrate are disclosed herein. In one embodiment, an input optical signal corresponding to a first wavelength and modulated with a data component may be directed into the gain medium (e.g., a quantum cascade intersubband laser) to cause emission of light of at least one wavelength distinct from the first wavelength and modulated with the data component of the input optical signal. At least a portion of the emitted light may then be reflected from the tunable Bragg grating to cause stimulated emission of the selected Bragg wavelength, thereby generating an output optical signal corresponding to a wavelength distinct from the first wavelength, and modulated with the data component of the input optical signal.

30 Claims, 5 Drawing Sheets

OTHER PUBLICATIONS

Tzanakaki, A., et al., "Analysis Of Tunable Wavelength Converters Based On Cross–Gain Modulation In Semiconductor Optical Amplifiers Operating In The Counter Propagating Mode," IEE Proceedings: Optoelectronics, Institution of Electrical Engineers, Stevenage, GB, vol. 147, No. 1 (Feb. 15, 2000) pp. 49–55.

Willner, A.E. et al., Tunable Compensation of Channel Degrading Effects Using Nonlinearly Chirped Passive Fiber Bragg Gratings, IEEE Journal of Selected Topics in Quantum Electronics, Sep./Oct. 1999, vol. 5, No. 5.

Giles, C.R., Lightwave Applications of Fiber Bragg Gratings, Journal of Lightwave Technology, Aug. 1997, vol. 15, No. 8.

Sugden, K. et al., Fabrication and Characterization of Bandpass Filters Based on Concatenated Chirped Fiber Gratings, Journal of Lightwave Technology, Aug. 1997, vol. 15, No. 8.

Erdogan, Turan, Fiber Grating Spectra, Journal of Lightwave Technology, Aug. 1997, vol. 15, No. 8.

Hill, Kenneth O. et al., Fiber Bragg Grating Technology Fundamentals and Overview, Journal of Lightwave Technology, Aug. 1997, vol. 15, No. 8.

Studenkov, P.V. et al, Asymmetric Twin–Waveguide 1.55–$\mu$m Wavelength Laser with a Distributed Bragg Reflector, IEEE Photonics Technology Letters, May 2000, vol. 12, No. 5.

www.encyclopedia.com/articles/07237.html, Results for Laser, retrieved Aug. 15, 2001, pp. 1–12.

www.encarta.msn.com/find/Concise.asp?z=1&pg=2&ti=761578658, Laser, an Encarta Encylopedia Article Titled "Laser", retrieved Aug. 15, 2001, pp. 1–9.

www.howstuffworks.com/laser.htm, Howstuffworks "How Lasers Work", retrieved Aug. 15, 2001, pp. 1–18.

Maluf, Dr. Nadim, Lasers: A Tutorial, New Focus, Opticon 2001, San Jose, CA, pp. 1–48.

* cited by examiner

METHOD AND APPARATUS FOR TUNABLE WAVELENGTH CONVERSION USING A BRAGG GRATING AND A LASER IN A SEMICONDUCTOR SUBSTRATE

TECHNICAL FIELD

This disclosure relates generally to optical devices, and more particularly, but not exclusively, to tunable wavelength converters utilizing a Bragg grating and a laser in a semiconductor substrate.

BACKGROUND INFORMATION

With the continued growth of the Internet and multimedia communications, the demand for increased capacity on networks has fueled the evolution and use of optical fibers. In an effort to optimize the data carrying capacity of optical fiber networks, dense wavelength-division multiplexing ("DWDM") systems and the like have been implemented to carry data via a plurality of wavelengths (i.e., channels) within a single fiber.

In a high-speed optical network, wavelength conversion, in which information is optically transformed from one wavelength to another will perform an important function. For instance, one may appreciate that in a large-scale optical network, as the density of traffic increases, the network may have many vacant channels on all of its links, but a single unique wavelength may be unavailable on any possible path between two end users. As such, it will be necessary to change the wavelength of some signals as they traverse the network in order to accommodate multiple users in the most efficient manner.

One straightforward solution to wavelength conversion is to simply convert a received optical signal to electronic form, and then re-transmit a second optical signal at the desired wavelength. However, the optical-electronic-optical conversion process is relatively slow, and limits the efficiency and speed of the optical network. Current types of fully optical wavelength converters utilize the non-linear optical properties of a semiconductor optical amplifier ("SOA"), such as cross-gain modulation, cross-phase modulation, and four-wave mixing. While these processes are more efficient than optical-electronic-optical conversions, the wavelength conversion speed of these processes is fundamentally limited by the carrier dynamics in the SOA. For example, the optical properties of the SOA are determined, at least in part, by carrier interband transitions that involve relatively slow processes such as Auger processes.

Commonly used optical components in DWDM systems include wavelength-division multiplexing transmitters and receivers, optical filters such as diffraction gratings, thin-film filters, fiber Bragg gratings, arrayed-waveguide gratings, optical add/drop multiplexers, and tunable lasers. For instance, lasers are well known devices that emit light through stimulated emission and produce coherent light beams with a frequency spectrum ranging from infrared to ultraviolet, and may be used in a vast array of applications. For example, in optical communication or networking applications, semiconductor lasers may be used to produce light or optical beams on which data or other information may be encoded and transmitted.

Other devices used in optical communication or networking applications are fiber-based Bragg gratings. A fiber Bragg grating is an optical fiber device that includes an optical fiber with periodic changes in the refractive index of fiber core materials along the fiber length, which may be formed by exposure of the photosensitive core to an intense optical interference pattern. With the changes in the refractive index along the fiber length, optical beams at a particular wavelength are reflected by the fiber Bragg grating while other wavelengths are allowed to propagate through the fiber.

One limitation of fiber Bragg gratings is that the particular wavelength that is reflected by the fiber Bragg grating is substantially fixed. Consequently, if different wavelengths of light are to be reflected, different fiber Bragg gratings are utilized. In some known fiber Bragg gratings, nominal adjustments to the reflected wavelength may be provided by physically or mechanically stretching the optical fiber of the fiber Bragg grating to modify the length of the optical fiber. The disadvantage of this technique is that the amount of adjustment to the reflected wavelength is relatively small and the optical fiber may suffer damage from the physical stress and strain of the stretching.

BRIEF DESCRIPTION OF THE VARIOUS VIEWS OF THE DRAWINGS

In the drawings, like reference numerals refer to like parts throughout the various views of the non-limiting and non-exhaustive embodiments of the present invention, and wherein.

DETAILED DESCRIPTION OF THE ILLUSTRATED EMBODIMENTS

Embodiments of a method and apparatus for tunable wavelength conversion using a Bragg grating and a laser disposed in a semiconductor substrate are described in detail herein. In the following description, numerous specific details are provided, such as the identification of various system components, to provide a thorough understanding of embodiments of the invention. One skilled in the art will recognize, however, that embodiments of the invention can be practiced without one or more of the specific details, or with other methods, components, materials, etc. In still other instances, well-known structures, materials, or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

As an overview, embodiments of the invention provide a method and apparatus for tunable wavelength conversion using a tunable Bragg grating and a gain medium (e.g., a laser) disposed in a semiconductor substrate. In one embodiment, an input optical signal corresponding to a first wavelength, which may be modulated with a data component (e.g., the input signal may comprise an optical communication signal propagating within an optical network), may be directed into the gain medium to cause the gain medium to emit light of at least one wavelength distinct from the first wavelength. For example, in one embodiment, the gain medium may comprise a quantum cascade intersubband laser, which, upon excitation by the input optical signal, may emit light of at least one wavelength distinct from the first wavelength of the input optical signal. In one embodiment, the light emitted from the gain medium may have an intensity proportionate to the intensity of the input optical signal, thereby modulating the light emitted from the gain medium with the data component of the input optical signal.

Light of the at least one wavelength distinct from the first wavelength of the input optical signal may then propagate through a laser cavity to a first end of the laser cavity defined by a first reflector. In one embodiment, the first reflector may comprise a tunable Bragg grating that, in response to an applied condition (e.g., heat or charge), may selectively reflect light having a tunable center wavelength. The reflected light may then cause stimulated emission of light of the same wavelength within the gain medium and transmission of at least a portion of the light having the tunable center wavelength from the tunable wavelength converter via a second reflector, defining a second end of the laser cavity, capable to at least partially transmit the light having the tunable center wavelength. In one embodiment, the output wavelength of the tunable wavelength converter may be selectively tuned by shifting the center wavelength of the semiconductor-based tunable Bragg grating.

In one embodiment of the present invention, a semiconductor-based tunable wavelength converter may be provided in a fully integrated solution on a single integrated circuit chip. Embodiments of the disclosed tunable wavelength converter may be used as components in applications including, for example, broadband optical networking systems or the like. Other features of the illustrated embodiments will be apparent to the reader from the foregoing and the appended claims, and as the detailed description and discussion is read in conjunction with the accompanying drawings.

Figure 1:
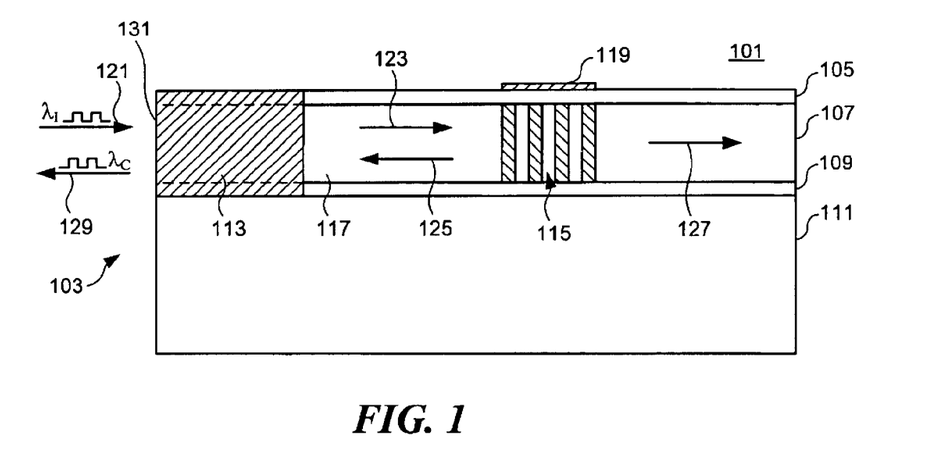
FIG. 1 is a block diagram illustrating an example tunable wavelength converter in accordance with an embodiment of the present invention.

With reference now to the drawings, and in particular to FIG. 1, an embodiment of a tunable wavelength converter 101 is illustrated in accordance with an embodiment of the present invention. As shown, one embodiment of the tunable wavelength converter 101 may be disposed on a silicon-on-insulator ("SOI") wafer 103 including a first semiconductor substrate 107 and a second semiconductor substrate 111. In one embodiment, the first semiconductor substrate 107 may include silicon. The first semiconductor substrate 107 may be disposed between a first insulating layer 105 and a second insulating layer 109, in an embodiment, the second insulating layer 109 being disposed between the first semiconductor substrate 107 and the second semiconductor substrate 111.

As shown in the illustrated embodiment, the tunable wavelength converter 101 includes a gain medium 113 disposed in the first semiconductor substrate 107. In one embodiment, the gain medium 113 may comprise a quantum cascade intersubband laser, which will be discussed in greater detail hereinafter in conjunction with FIG. 2. In addition, the tunable wavelength converter 101 includes a tunable Bragg grating 115 disposed in the first semiconductor substrate 107 to form a first reflector defining a first end of a laser cavity 117 disposed in the first semiconductor substrate 107, in an embodiment. As will be discussed in greater detail hereinafter, the tunable Bragg grating 115 includes a plurality of interfaces along the first semiconductor substrate 107 to form a plurality of perturbations of a refractive index along the tunable Bragg grating 115 to selectively reflect light having a tunable center wavelength. In one embodiment, a heater 119, disposed as shown proximate to the semiconductor substrate including the tunable Bragg grating 115, may be used to locally adjust a temperature of the semiconductor substrate including the tunable Bragg grating 115 to adjust the tunable center wavelength reflected from the tunable Bragg grating 115. It will be appreciated that reference herein to a "tunable center wavelength" is intended to refer to a center wavelength of a relatively narrow range of wavelengths (e.g., 10s of picometers) that may be effectively reflected from the tunable Bragg gratings in accordance with embodiments of the present invention.

In one embodiment, the laser cavity 117, disposed in the first semiconductor substrate 107, may be defined by the first and second insulating layers 105 and 109, by the first reflector including the tunable Bragg grating 115, and by a second reflector 131 comprising a component of the gain medium 113. In one embodiment, the second reflector 131 may comprise a cleaved surface or facet, or a coated surface with a desired reflectivity. The second reflector 131 may be capable to at least partially transmit light having the tunable center wavelength reflected from the tunable Bragg grating 115, in an embodiment. As will be discussed in greater detail hereinafter, the laser cavity 117 comprises, in one embodiment, the gain medium 113 and a waveguide formed in the first semiconductor substrate 107.

In operation, electricity is first converted into light in the laser cavity 117 via the gain medium 113. In one embodiment, an input optical signal 121, having a first wavelength and including data encoded therein, may be directed into the gain medium 113 to cause emission of light 123 corresponding to a range of wavelengths from the gain medium 113. It will be appreciated that because electrons within any particular energy band within the gain medium 113 may have slightly different energies, transitions from one energy band to another correspond to a variety of energies, and hence wavelengths, resulting in a spectrum of emitted light from the gain medium 113. The emitted light 123, having at least one wavelength distinct from the first wavelength corresponding to the input optical signal 121, may then propagate through the laser cavity 117 to the first reflector including the tunable Bragg grating 115. In one embodiment, the emitted light 123 may be modulated with the data encoded in the input optical signal 121 in response to an interaction with the input optical signal 121 in the gain medium 113.

In one embodiment, the tunable Bragg grating 115 reflects a portion of the light 123 having a tunable center wavelength corresponding to a Bragg wavelength (i.e., the wavelength affected by the Bragg grating) associated with the tunable Bragg grating 115 (the portion of reflected light from the tunable Bragg grating corresponding to the Bragg wavelength is shown at reference numeral 125). The remaining portion of the emitted light 123 not corresponding to the Bragg wavelength may pass through the Bragg grating substantially unaffected, as shown at reference numeral 127. Light corresponding to the Bragg wavelength in optical beams 123 and 125 may then continue to reflect back and forth between the second reflector 131 and the tunable Bragg grating 115 such that lasing, or light amplification by the stimulated emission of radiation, occurs in the laser cavity 117.

In one embodiment, since the reflection spectrum of the tunable Bragg grating 115 corresponds to a relatively narrow bandwidth (e.g., <1 nm), lasing occurs in the laser cavity 117 for only a correspondingly narrow frequency range. As mentioned previously, the second reflector 131 is only partially reflective, thereby allowing at least a portion of the light corresponding to the Bragg wavelength (see, e.g., reference numeral 125) to pass through the second reflector 131 and be transmitted from the tunable wavelength converter as an output optical signal 129 having the tunable center wavelength and modulated with the data carried by the input optical signal 121, in an embodiment.

Figure 2:
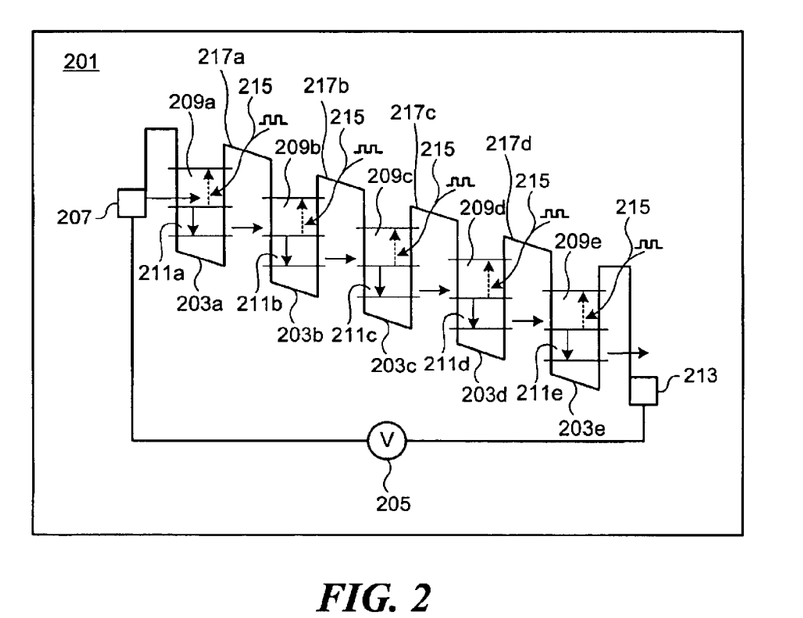
FIG. 2 is a schematic diagram illustrating an example quantum cascade intersubband laser with an input optical signal (pump) beam in accordance with an embodiment of the present invention.

With reference now primarily to FIG. 2, a schematic illustration of an example quantum cascade intersubband laser ("QCIL") 201 with an input optical signal beam having the first wavelength is shown in accordance with an embodiment of the present invention. As mentioned previously, the QCIL 201 may comprise the gain medium (see, e.g., reference numeral 113, FIG. 1) of the tunable wavelength converter (see, e.g., reference numeral 101, FIG. 1) in an embodiment of the present invention. As will be appreciated by those skilled in the art, the QCIL 201 comprises a plurality of quantum wells 203a–e. In one embodiment, the plurality of quantum wells 203a–e comprise materials capable to emit light within a range of wavelengths from approximately 1500 nm to approximately 1600 nm in response to electron transitions between subbands of the quantum wells 203a–e. For example, in one embodiment the plurality of quantum wells may comprise at least one of a combination of AlGaN/GaN (Aluminum-Galium-Nitride/Galium-Nitride) or a combination of InGaAs/AlAsSb (Indium-Galium-Arsenide/Aluminum-Arsenide-Antimony). It will be appreciated that other quantum well materials may be utilized for different converted wavelengths in accordance with other embodiments of the present invention.

In operation, a voltage 205 may be applied to the QCIL 201 at an injector 207, which, in response to the applied voltage 205, effectively injects electrons into an upper level 209a of the first quantum well 203a. After transiting to a lower level 211a of the first quantum well 203a, the electrons tunnel through a barrier 217a into an upper level 209b of the second quantum well 203b. The electrons then transition to a lower level 211b of the second quantum well 203b, and the process continues to repeat itself through the third, fourth, and fifth quantum wells 203c, 203d, and 203e, (comprising upper levels 209c–e and lower levels 211c–e, and separated by barriers 217b–d) respectively, until the electrons reach a collector 213. The current injection induces a population inversion between the upper and lower subbands (i.e., levels) of the multiple quantum wells 203a–e, producing the lasing effect in response to a stimulating photon, in an embodiment. Because the intersubband relaxation time is very short (e.g., picoseconds), ultra-fast wavelength conversion may be provided by the tunable wavelength converters in accordance with embodiments of the present invention.

In one embodiment of the present invention, the input optical signal (illustrated in FIG. 2 at reference numeral 215) maybe directed into the QCIL 201 and deplete the electrons in the upper subbands 209a–e of the multiple quantum wells 203a–e, thereby reducing the gain of the QCIL 201. Because, for a given applied voltage (e.g., the applied voltage 205), the electron density difference between the upper and lower subbands 209a–e and 211a–e, respectively, of the multiple quantum wells 203a–e is proportional to the intensity of the input optical signal 215, the light emitted (see, e.g., the light 123, FIG. 1) from the QCIL 201 has an intensity corresponding to the input optical signal 215 (see also, e.g., reference numeral 121, FIG. 1) and maybe modulated with the data encoded in the input optical signal 215, in an embodiment.

Figure 3:
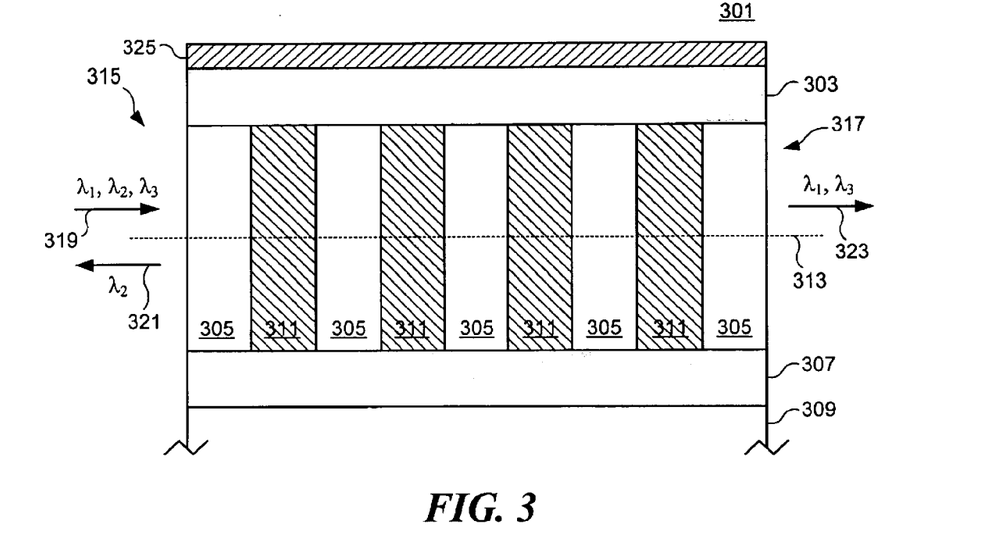
FIG. 3 is a block diagram illustrating a cross-section of an example tunable Bragg grating disposed in a semiconductor substrate including a heater that may be utilized in a tunable wavelength converter in accordance with an embodiment of the present invention.

With reference now primarily to FIG. 3, a block diagram illustrating a cross-section of an example tunable Bragg grating 301 disposed in a semiconductor substrate and including a heater that may be utilized in a tunable wavelength converter (see, e.g., reference numeral 101, FIG. 1) is shown in accordance with an embodiment of the present invention. In one embodiment, the tunable Bragg grating 301 may be used in place of the tunable Bragg grating 115 of FIG. 1. In one embodiment, the tunable Bragg grating 301 comprises a silicon/polysilicon grating, including a plurality of interfaces between silicon regions 305 and polysilicon regions 311. It will be appreciated that silicon and polysilicon are used only as example materials for purposes of explanation, and that other semiconductor materials including Group III–V semiconductor materials or the like may be used in other embodiments of the present invention.

In the illustrated embodiment, a plurality of polysilicon regions 311 are disposed in a first silicon semiconductor substrate 305 to form periodic or quasi-periodic perturbations of an effective refractive index ($n_{eff}$) along an optical path 313 through the first silicon semiconductor substrate 305. In one embodiment, in which silicon and polysilicon are utilized, having effective refractive indexes of $n_{Si}$ and $n_{poly}$, respectively, a small effective refractive index difference $\Delta n_{eff}$ (or $n_{poly} - n_{Si}$) may be provided at each of the plurality of interfaces between polysilicon regions 311 and silicon regions 305. In one embodiment, $\Delta n_{eff}$ may be within a range of from approximately 0.005 to approximately 0.03. It will be appreciated however that other value ranges for $\Delta n_{eff}$ may be utilized in accordance with other embodiments of the present invention.

As illustrated in FIG. 3, the first silicon semiconductor substrate 305 may, in one embodiment, comprise a part of a SOI wafer 315. As such, a second insulating layer 307 or a buried oxide layer may be disposed between the first silicon semiconductor layer 305 and a second semiconductor substrate 309. In one embodiment, a first insulating layer 303 may be included such that the first silicon semiconductor substrate 305 is disposed between the first and second insulating layers 303 and 307. In one embodiment, the first insulating layer 303 may comprise an interlayer dielectric layer of the SOI wafer 315. In one embodiment, the first and second insulating layers 303 and 307 may include an oxide material or the like. As a result, a waveguide 317 including the optical path 313 may be provided in the first silicon semiconductor substrate 305 with cladding provided by the first and second insulating layers 303 and 307.

Figure 4:
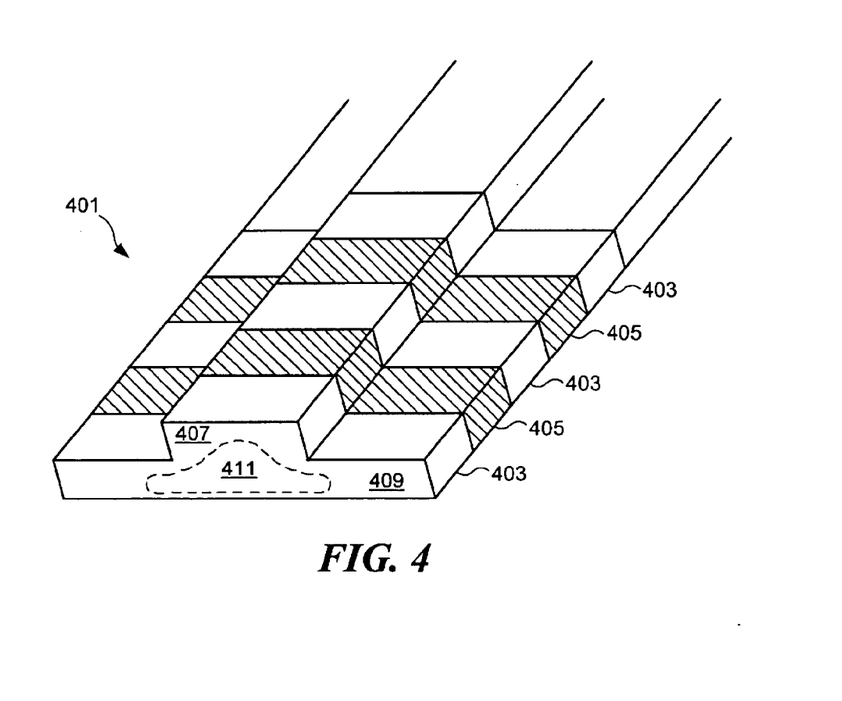
FIG. 4 is a perspective view of an example tunable Bragg grating disposed in a semiconductor substrate including a rib waveguide that may be utilized in a tunable wavelength converter in accordance with an embodiment of the present invention.

In one embodiment, the waveguide 317 comprises a rib waveguide such as that illustrated in FIG. 4. FIG. 4 is a perspective view of an embodiment of a rib waveguide 401 comprising a tunable Bragg grating disposed in a semiconductor substrate in accordance with an embodiment of the present invention. In one embodiment, the rib waveguide 401 may be disposed between the first and second insulating layers 303 and 307 of the SOI wafer 315 illustrated in FIG. 3. In one embodiment, the rib waveguide 401 may include interfacing regions of silicon 403 and regions of polysilicon 405 to form periodic or quasi-periodic perturbations of a refractive index along an optical path through the rib waveguide 401. It will be appreciated that the rib waveguide 401 may comprise a rib region 407 and a slab region 409, in an embodiment. An intensity distribution of a single mode optical beam 411 is shown propagating through the rib waveguide 401 such that the majority of the optical beam 411 propagates through a portion of rib region 407 towards the interior of the rib waveguide 401. In addition, a portion of the optical beam 411 propagates through a portion of the slab region 409 towards the interior of the rib waveguide 401.

With continued reference to FIG. 3, light 319 (e.g., emitted from the gain medium 113, FIG. 1) comprising a plurality of wavelengths $\lambda_1$, $\lambda_2$, and $\lambda_3$ may be incident on the plurality of interfaces formed between the silicon regions 305 and the polysilicon regions 311 of the tunable Bragg grating 301, in an embodiment. It will be appreciated that although the illustrated embodiment includes three wavelengths of light, other embodiments of the invention may include different numbers of wavelengths in the light 319.

As mentioned previously, the plurality of interfaces between the silicon regions 305 and the polysilicon regions 311 form a plurality of perturbations of the refractive index along the optical path 313 of the waveguide 317. As a result of these differences in refractive index ($n_{eff}$), a multiple reflection of the light 319 occurs at the plurality of interfaces between the silicon regions 305 and the polysilicon regions 311 along the optical path 313. In one embodiment, a Bragg reflection occurs when a Bragg condition or phase matching condition is satisfied. For instance, for uniform Bragg gratings, when the Bragg condition $m\lambda_B = 2n_{eff}\Lambda$ is satisfied, where m is the diffraction order, $\lambda_B$ is the Bragg wavelength, $n_{eff}$ is the effective index of refraction of the waveguide 317, and $\Lambda$ is the period of the grating, a Bragg reflection occurs.

For example, FIG. 3 shows a Bragg condition existing for $\lambda_B$ equal to $\lambda_2$. Accordingly, light 321 corresponding to the wavelength $\lambda_2$ is shown reflected back in the direction opposite to which the light 319 including the plurality of wavelengths $\lambda_1$, $\lambda_2$, and $\lambda_3$ entered the waveguide 317. In addition, the remainder of the light 319 (i.e., that not reflected by the grating interfaces) continues to propagate along the optical path 313 through the waveguide 317 in the direction in which the light 319 entered the waveguide 317 (see, e.g., reference numeral 323 indicating the light corresponding to wavelengths $\lambda_1$ and $\lambda_3$). In one embodiment, the Bragg wavelength $\lambda_2$ may comprise the converted wavelength of the output optical signal 129 (see, e.g., FIG. 1) modulated with the data encoded in the input optical signal (see, e.g., reference numeral 121, FIG. 1).

In one embodiment, the Bragg wavelength (i.e., the tunable center wavelength) that is reflected by the plurality of interfaces between the silicon regions 305 and the polysilicon regions 311 may be tunable or adjustable via a heater 325 disposed proximate to the waveguide 317. In one embodiment, the heater 325 comprises a thin-film heater or the like that controls the temperature of the first silicon semiconductor substrate 305 and the polysilicon regions 311 in the waveguide 317 along the optical path 313. It will be appreciated that silicon and polysilicon have large refractive index variations responsive to temperature variations on the order of approximately $2 \times 10^{-4}/°$ K, and that the refractive index variations with temperature for semiconductor materials such as silicon and/or polysilicon are two orders of magnitude greater than other materials such as for example silica or the like. Thus, by controlling the temperature of the first silicon semiconductor substrate 305 and the polysilicon regions 311, relatively significant shifts in the center wavelength of the light reflected by the interfaces of the tunable Bragg grating 301 may be provided in accordance with an embodiment of the present invention.

Figure 5:
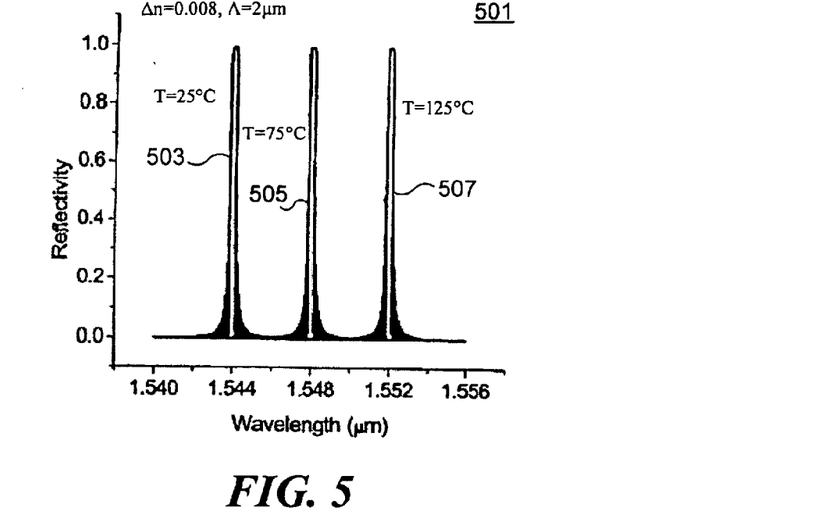
FIG. 5 is a graphical representation illustrating a relationship between reflectivity and wavelength at different temperatures in an example tunable Bragg grating in accordance with an embodiment of the present invention.

With reference now primarily to FIG. 5, a graphical representation 501 illustrating the relationship between reflectivity and wavelength at different temperatures in an example tunable Bragg grating is shown in accordance with an embodiment of the present invention. In one embodiment, a temperature of the silicon/polysilicon regions of the Bragg grating may be adjusted between 25° C., 75° C., and 125° C. In the illustrated embodiment, the difference in the effective refractive indexes between the silicon regions and polysilicon regions ($\Delta n_{eff}$) is approximately 0.008, and the period of the grating $\Lambda$ is approximately 2 $\mu$m. A first plot 503 shows that at 25° C., the center wavelength of the light that is reflected by the example silicon/polysilicon Bragg grating is approximately 1.544 $\mu$m in the illustrated embodiment. In comparison, a second plot 505 shows that at 75° C., the center wavelength of the light that is reflected by the example silicon/polysilicon Bragg grating is approximately 1.548 $\mu$m, while a third plot 507 shows that at 125° C., the center wavelength of the light that is reflected by the example silicon/polysilicon Bragg grating is shifted or tuned to approximately 1.552 $\mu$m. In one embodiment, a thin-film heater (e.g., the heater 325, FIG. 3) provides center wavelength tuning speeds on the order of microseconds.

It will be appreciated that the materials, dimensions, wavelengths, and refractive index values described and illustrated in conjunction with FIG. 5 are provided as an example only, and that other materials, dimensions, wavelengths, and refractive index values may be utilized in accordance with other embodiments of the present invention.

Figure 6A:
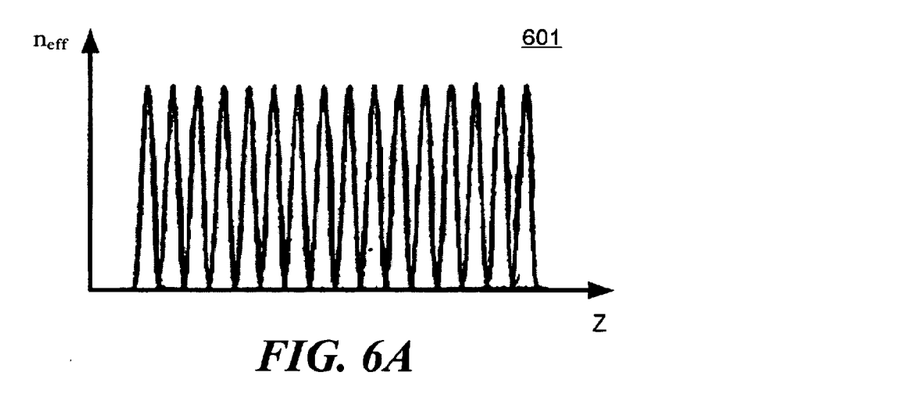
FIG. 6A is a graphical representation illustrating an effective index of refraction along an optical path of an example tunable uniform Bragg grating in accordance with an embodiment of the present invention.
Figure 6B:
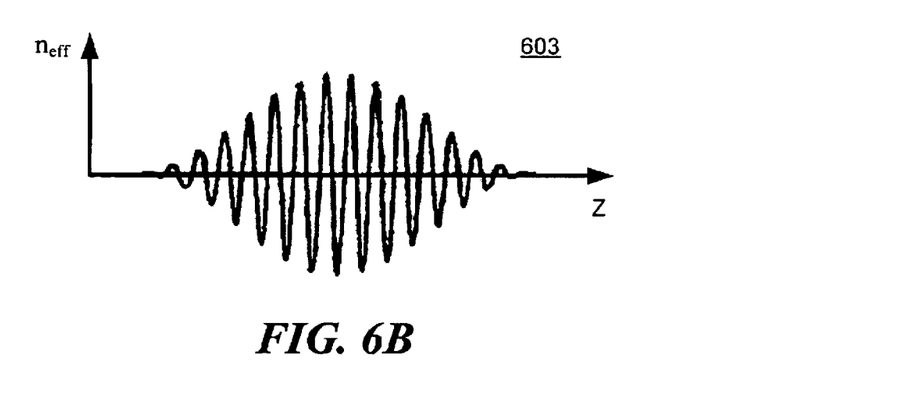
FIG. 6B is a graphical representation illustrating an effective index of refraction along an optical path of an example tunable apodized Bragg grating in accordance with an embodiment of the present invention.

The reader will appreciate that, in one embodiment, there are sidelobes at the edges of each maxima of the plots 503, 505, and 507 illustrated in FIG. 5. When uniform or periodic Bragg gratings are utilized, the sidelobes are usually relatively large. For instance, the periodic perturbations in the effective refractive index along the optical path of a uniform or periodic Bragg grating are shown in the graphical representation 601 illustrated in FIG. 6A. As shown along the y-axis, the effective refractive index $n_{eff}$ is perturbed periodically or regularly down the optical path, shown as Z along the x-axis of the graphical representation 601. In contrast, use of an apodized Bragg grating may reduce the size of the sidelobes at the edges of each maxima of the plots 503, 505, and 507 illustrated in FIG. 5. For instance, the periodic perturbations in the effective refractive index along the optical path of an apodized Bragg grating are shown in a graphical representation 603 illustrated in FIG. 6B. It will be appreciated that other types of apodized or other gratings may be utilized in accordance with other embodiments of the present invention.

Figure 7:
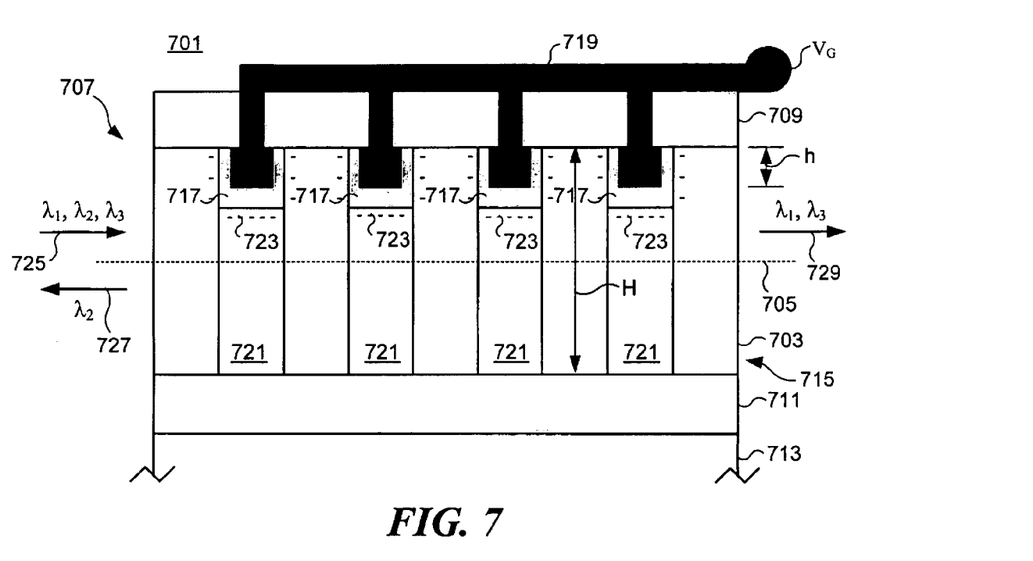
FIG. 7 is a block diagram illustrating a cross-section of another example tunable Bragg grating disposed in a semiconductor substrate including charge-modulated regions that may be utilized in a tunable wavelength converter in accordance with an embodiment of the present invention.

With reference now primarily to FIG. 7, a block diagram illustrating a cross-section of another example tunable Bragg grating 701 disposed in a semiconductor substrate and including charge-modulated regions that may be utilized in a tunable wavelength converter (see, e.g., reference numeral 101, FIG. 1) is shown in accordance with an embodiment of the present invention. In one embodiment, the tunable Bragg grating 701 may be used in place of the tunable Bragg grating 115 of FIG. 1. In the illustrated embodiment, the tunable Bragg grating 701 includes a first semiconductor substrate 703 having an optical path 705 through which light (e.g., light emitted from the gain medium 113, FIG. 1) may be directed. In one embodiment, the first semiconductor substrate 703 may be included in a SOI wafer 707 between a first insulating layer 709 and a second insulating layer 711, and may include a second semiconductor substrate 713 separated from the first semiconductor substrate 703 by the second insulating layer 711. As described previously in conjunction with FIG. 3, an optical waveguide 715 may be provided within the first semiconductor substrate 703.

In one embodiment, the tunable Bragg grating 701 includes a plurality of trenched 5 silicon structures comprising a plurality of conductor-insulator-semiconductor structures 717 similar to, for example, metal-oxide-semiconductor ("MOS") structures, disposed along the optical path 705. Each of the plurality of structures 717 is coupled to receive a modulation signal $V_G$ through a conductor 719, coupled to each of the plurality of structures 717 through the first insulating layer 709. In one embodiment, the height of each of the plurality of structures 717 is h, the height h being chosen such that propagation loss of light in the waveguide 715 is acceptable.

In one embodiment, periodic or quasi-periodic perturbations in an effective refractive index $n_{eff}$ may be provided along the optical path 705 related or equal to a function of the geometry of the waveguide 715 along the optical path 705, as well as the refractive index of the specific medium used (e.g., $n_{Si}$) and the wavelength λ of the light propagating through the waveguide 715. Accordingly, assuming the semiconductor substrate 703 includes silicon, the effective refractive index $n_{eff}$ is a function of the height H of the waveguide 715 not including the structures 717, $n_{Si}$ and λ. In regions 721 of the waveguide 715 including the structures 717, the effective refractive index $n_{eff}'$ is a function of the height (H−h) of the waveguide 715, including the structures 717, $n_{Si}$ and λ. Thus, the difference in the effective refractive index $\Delta n_{eff}$ is equal to $n_{eff} - n_{eff}'$.

In one embodiment, the structures 717 may be biased in response to the modulation signal $V_G$ through the conductor 719 to affect the concentration of free charge carriers in charge modulated regions 723 in the first semiconductor substrate 703 proximate to the structures 717. For example, assuming a positive voltage is applied with the modulation signal $V_G$ through the conductor 719, electrons in the first semiconductor substrate 703 are swept into the charge modulated regions 723. If less positive voltage is applied, the concentration of free charge carriers swept into the charge modulated regions 723 may be reduced. It will be appreciated that the polarities of the charges and voltages may be reversed, and that a greater or lesser number of structures 717 may be included in accordance with other embodiments of the present invention.

In one embodiment, the effective refractive index $n_{eff}$ in the charge modulated regions 723 may be modulated in response to the modulation signal $V_G$ via a plasma optical effect arising in response to an interaction between an optical electric field vector of light propagating through the waveguide 715 and the free charge carriers that may be present along the optical path 705. In a silicon substrate, the change in the effective refractive index $\Delta n_{eff}$ due to a free electron ($\Delta N_e$) and hole ($\Delta N_h$) concentration change is given by the following:

$$\Delta n_{eff} = -\frac{e^2 \lambda^2}{8\pi^2 c^2 \varepsilon_0 n_0} \left( \frac{\Delta N_e}{m_e^*} + \frac{\Delta N_h}{m_h^*} \right)$$

where $n_0$ is the nominal refractive index for silicon, e is the electronic charge, c is the speed of light, $\epsilon_0$ is the permeativity of free space, and $m_e^*$ and $m_h^*$ are the electron and hole effective masses, respectively.

In operation, the tunable Bragg grating 701 may function in a manner similar to that described previously in conjunction with FIG. 3. In one embodiment, light 725 (e.g., light emitted from the gain medium 113, FIG. 1) comprising a plurality of wavelengths $\lambda_1$, $\lambda_2$, and $\lambda_3$ may be incident on the plurality of interfaces formed between the regions 721 including the charge modulated regions 723 and the remaining regions of the first semiconductor substrate 703 of the tunable Bragg grating 701, in an embodiment. It will be appreciated that although the illustrated embodiment includes three wavelengths of light, other embodiments of the invention may include different numbers of wavelengths in the light 725. As the light 725 encounters the periodic or quasi-periodic perturbations in the refractive index along the optical path 705, a Bragg condition, as described previously, may be satisfied, causing light corresponding to the Bragg wavelength (in this case, light of wavelength $\lambda_2$ 727) to be reflected by the interfaces of the tunable Bragg grating 701. The remainder of the incoming light 725 (i.e., that not reflected by the interfaces of the tunable Bragg grating 701) may then pass through the grating unaffected in the direction in which the light 725 entered the waveguide 715 (see, e.g., reference numeral 729 indicating the light corresponding to wavelengths $\lambda_1$ and $\lambda_3$).

In one embodiment, the Bragg wavelength (i.e., the tunable center wavelength) that is reflected by the plurality of interfaces between the regions 721 including the charge modulated regions 723 and the remaining regions of the first semiconductor substrate 703 of the tunable Bragg grating may be tunable or adjustable by appropriately modulating charge in the charge modulated regions 723 via modulation signal $V_G$. As discussed previously, the effective refractive index ($\Delta n_{eff}$) along the optical path 705 may be modulated in response to the modulation signal $V_G$ to produce relatively significant shifts in the center wavelength of the light reflected by the interfaces of the tunable Bragg grating 701 in accordance with an embodiment of the present invention.

Figure 8:
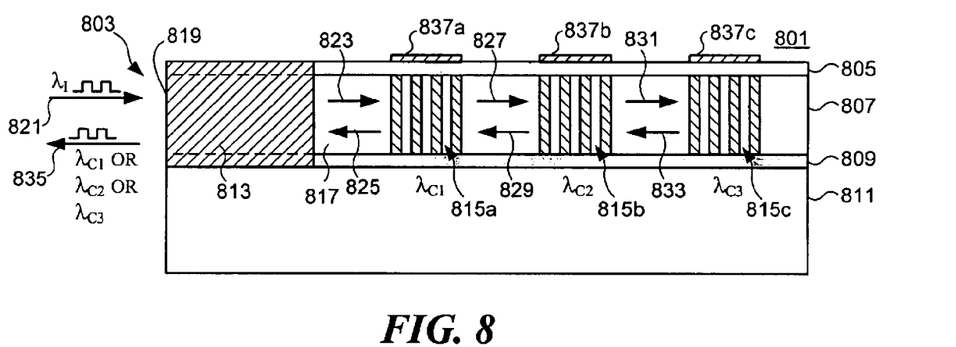
FIG. 8 is a block diagram illustrating another example tunable wavelength converter in accordance with an embodiment of the present invention.

With reference now primarily to FIG. 8, a block diagram illustrating another example tunable wavelength converter 801 is shown in accordance with an embodiment of the present invention. Like the embodiment illustrated in FIG. 1, the tunable wavelength converter 801 of FIG. 8 may be disposed on a SOI wafer 803 including a first semiconductor substrate 807 disposed between a first insulating layer 805 and a second insulating layer 809, as well as a second semiconductor substrate 811 separated from the first semiconductor substrate 807 by the second insulating layer 809.

As shown in the illustrated embodiment, the tunable wavelength converter 801 includes a gain medium 813, which may comprise a QCIL in an embodiment, and a plurality of tunable Bragg gratings 815a–c disposed in the first semiconductor substrate 807. It will be appreciated that other embodiments may include a greater or lesser number of tunable Bragg gratings. In one embodiment, the plurality of tunable Bragg gratings (e.g., tunable Bragg gratings 815a–c) collectively have a tunable range that covers the full spectrum of the gain medium 813. A laser cavity 817 may be defined, in one embodiment, in the first semiconductor substrate 807 between the first and second insulating layers 805 and 809, and between reflectors comprising the plurality of tunable Bragg gratings 815a–c and a second reflector 819 comprising a part of the gain medium 813. In one embodiment, the second reflector 819 may comprise a cleaved surface or facet.

In one embodiment, each of the plurality of tunable Bragg gratings 815a–c may be tuned to correspond to a different Bragg wavelength $\lambda_{C1}$, $\lambda_{C2}$, and $\lambda_{C3}$, respectively. The plurality of tunable Bragg gratings 815a–c act, in an embodiment, as reflectors to selectively reflect light corresponding to the respective Bragg wavelength corresponding to each tunable Bragg grating 815a–c. In operation, light 823 corresponding to a plurality of wavelengths (e.g., $\lambda_{C1}$, $\lambda_{C2}$, and $\lambda_{C3}$) may be generated from the gain medium 813, in an embodiment, in response to an input optical signal 821 corresponding to a first wavelength and including data modulated therein. In one embodiment, the emitted light 823 will correspond to at least one wavelength different from the first wavelength of the input optical signal 821, and will be modulated with the data as discussed previously in conjunction with FIGS. 1 and 2.

A portion of the light 823 having a center wavelength of $\lambda_{C1}$ may be reflected by the first tunable Bragg grating 815a having a Bragg wavelength of $\lambda_{C1}$ (the reflected portion is illustrated at reference numeral 825). The remaining portion of the emitted light 823 (the remaining portion is illustrated at reference numeral 827) may continue to propagate through the laser cavity 817 to the second tunable Bragg grating 815b. At this point, another portion of the emitted light 823 having a center wavelength of $\lambda_{C2}$ may be reflected by the second tunable Bragg grating 815b having a Bragg wavelength of $\lambda_{C2}$ (the reflected portion is illustrated at reference numeral 829). Again, the remaining portion of the emitted light 823 (the remaining portion is illustrated at reference numeral 831) may continue to propagate through the laser cavity 817 to the third tunable Bragg grating 815c. Once again, another portion of the emitted light 823 having a center wavelength of $\lambda_{C3}$ may be reflected by the third tunable Bragg grating 815c having a Bragg wavelength of $\lambda_{C3}$ (the reflected portion is illustrated at reference numeral 833). In an embodiment in which the plurality of tunable Bragg gratings are configured to reflect the full spectrum of light emitted from the gain medium 813, a wider range of wavelengths may be made available into which to convert the input optical signal 821.

In one embodiment, the second reflector 819 is only partially reflective such that an output optical signal 835 may be generated by the tunable wavelength converter 801 corresponding to at least one converted wavelength $\lambda_{C1}$, $\lambda_{C2}$, or $\lambda_{C3}$ including the data encoded in the input optical signal 821. In one embodiment, the plurality of tunable Bragg gratings 815a–c may be tuned via a plurality of heaters 837a–c disposed proximate to the semiconductor substrate including the tunable Bragg gratings 815a–c in a manner similar to that described previously in conjunction with FIG. 3. It will be appreciated that any one or more of the plurality of tunable Bragg gratings 815a–c may be "tuned" such that it no longer reflects any of the wavelengths corresponding to the light 823 emitted from the gain medium 813, thereby providing an output optical signal (e.g., the output optical signal 835) corresponding to a distinct selected converted wavelength (e.g., $\lambda_{C1}$, or $\lambda_{C2}$, or $\lambda_{C3}$), and not a plurality of wavelengths.

Figure 9:
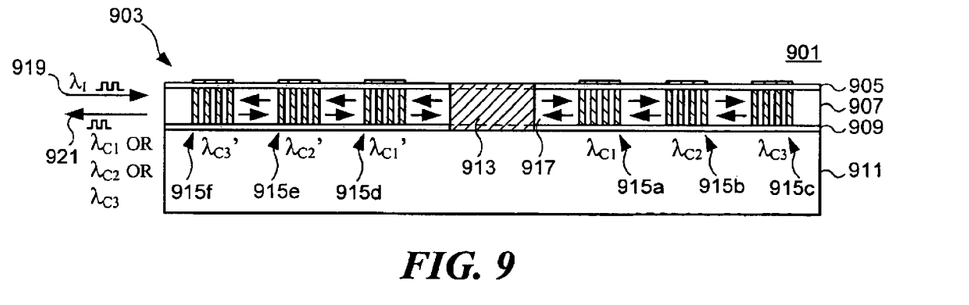
FIG. 9 is a block diagram illustrating yet another example tunable wavelength converter in accordance with an embodiment of the present invention.

With reference now primarily to FIG. 9, a block diagram illustrating yet another example tunable wavelength converter 901 is shown in accordance with an embodiment of the present invention. Like the embodiments illustrated in FIGS. 1 and 8, the tunable wavelength converter 901 of FIG. 9 may be disposed on a SOI wafer 903 including a first semiconductor substrate 907 disposed between a first insulating layer 905 and a second insulating layer 909, as well as a second semiconductor substrate 911 separated from the first semiconductor substrate 907 by the second insulating layer 909.

As shown in the illustrated embodiment, the tunable wavelength converter 901 includes a gain medium 913, which may comprise a QCIL in an embodiment, and a plurality of tunable Bragg gratings 915a–f disposed in the first semiconductor substrate 907. It will be appreciated that other embodiments may include a greater or lesser number of tunable Bragg gratings. In addition, in one embodiment, the tunable wavelength converter 901 includes a laser cavity 917 defined by the first and second insulating layers 905 and 909, and by the reflectors provided by the plurality of tunable Bragg gratings 915a–c at one end, and at the other end by the reflectors provided by the plurality of tunable Bragg gratings 915d–f. In one embodiment, the reflectors provided by the plurality of tunable Bragg gratings 915d–f may be designed such that they are not totally reflective, thereby permitting a portion of the light corresponding to the respective Bragg wavelength to pass through and be emitted from the tunable wavelength converter 901. It will be appreciated that in another embodiment, the reflectors provided by the plurality of tunable Bragg gratings 915a–c maybe, or may also be (i.e., in addition to gratings 915d–e), designed such that they are not totally reflective, thereby permitting a portion of the light corresponding to the respective Bragg wavelength to pass through and be emitted from the tunable wavelength converter 901. Other features of the tunable wavelength converter 901 may be similar to those described above in conjunction with FIGS. 1 and 8.

In one embodiment, each of the plurality of tunable Bragg gratings 915a–f maybe tuned to correspond to a different Bragg wavelength $\lambda_{C1}$, $\lambda_{C2}$, $\lambda_{C3}$, $\lambda_{C1}'$, $\lambda_{C2}'$, and $\lambda_{C3}'$, respectively, to act as reflectors to selectively reflect light corresponding to the respective Bragg wavelength. In one embodiment, one of the Bragg wavelengths $\lambda_{C1}$, $\lambda_{C2}$, or $\lambda_{C3}$ may be tuned to match or be equal to one of the Bragg wavelengths $\lambda_{C1}'$, $\lambda_{C2}'$, or $\lambda_{C3}'$. The remaining ones of the Bragg wavelengths $\lambda_{C1}$, $\lambda_{C2}$, or $\lambda_{C3}$ may be tuned not to be equal to any of the remaining ones of the Bragg wavelengths $\lambda_{C1}'$, $\lambda_{C2}'$, or $\lambda_{C3}'$. For example, $\lambda_2 = \lambda_2'$, $\lambda_1 \neq \lambda_1'$, and $\lambda_3 \neq \lambda_3'$. In one embodiment, the tunable Bragg gratings 915a–f may be tuned to cover the full spectrum of the gain medium 913.

In one embodiment, an input optical signal 919 corresponding to a first wavelength and having data encoded therein may be directed into the tunable wavelength converter 901 and cause light to be emitted from the gain medium 913. In one embodiment, the light emitted from the gain medium 913 may then be reflected from the respective plurality of Bragg gratings 915a–f in a manner similar to that described above in conjunction with FIG. 8. Since, in the present example, $\lambda_2 = \lambda_2'$, the portions of the light corresponding to the wavelengths $\lambda_2$, $\lambda_2'$ continue to be reflected back and forth between the correspondingly tuned Bragg gratings, as described previously, such that lasing occurs in the laser cavity 917. In one embodiment, the light emitted from the gain medium 913 may be modulated with the data encoded in the input optical signal 919, as described previously in conjunction with FIGS. 1 and 2, such that an output optical signal 921 corresponding to one of the converted wavelengths (e.g., $\lambda_{C1}$, $\lambda_{C1}'$ or $\lambda_{C2}$, $\lambda_{C2}'$ or $\lambda_{C3}$, $\lambda_{C3}'$) may be emitted from the tunable wavelength converter 901 with the data encoded therein. It will be appreciated that any presence of unselected wavelengths (e.g., $\lambda_{C1}$, $\lambda_{C1}'$ or $\lambda_{C3}$, $\lambda_{C3}'$) in the output optical signal 921 may appear merely as small lobes since they will not be internally reflected within the laser cavity 917 and lasing does not occur for these unselected wavelengths.

In another embodiment, a single grating GI such as a sampled grating (not shown) maybe used to reflect multiple wavelengths (e.g., $\lambda_{C1}$, $\lambda_{C2}$, and $\lambda_{C3}$) instead of separate gratings 915a–c, since a single grating may have multiple diffraction orders. Similarly, a second grating G2 (not shown) of slightly different pitch may be used to reflect multiple wavelengths (e.g., $\lambda_{C1}'$, $\lambda_{C2}'$, and $\lambda_{C3}'$) and replace the separate gratings 915d–f. In this embodiment, one of the Bragg orders or Bragg wavelengths of Bragg grating G1 may be tuned to match or be equal to one of the Bragg orders or Bragg wavelengths of the Bragg grating G2. The reflective process then works in a manner similar to that described previously in conjunction with FIG. 9, except that the reflections are now coming from single gratings rather that separate gratings.

Figures 10, 11:
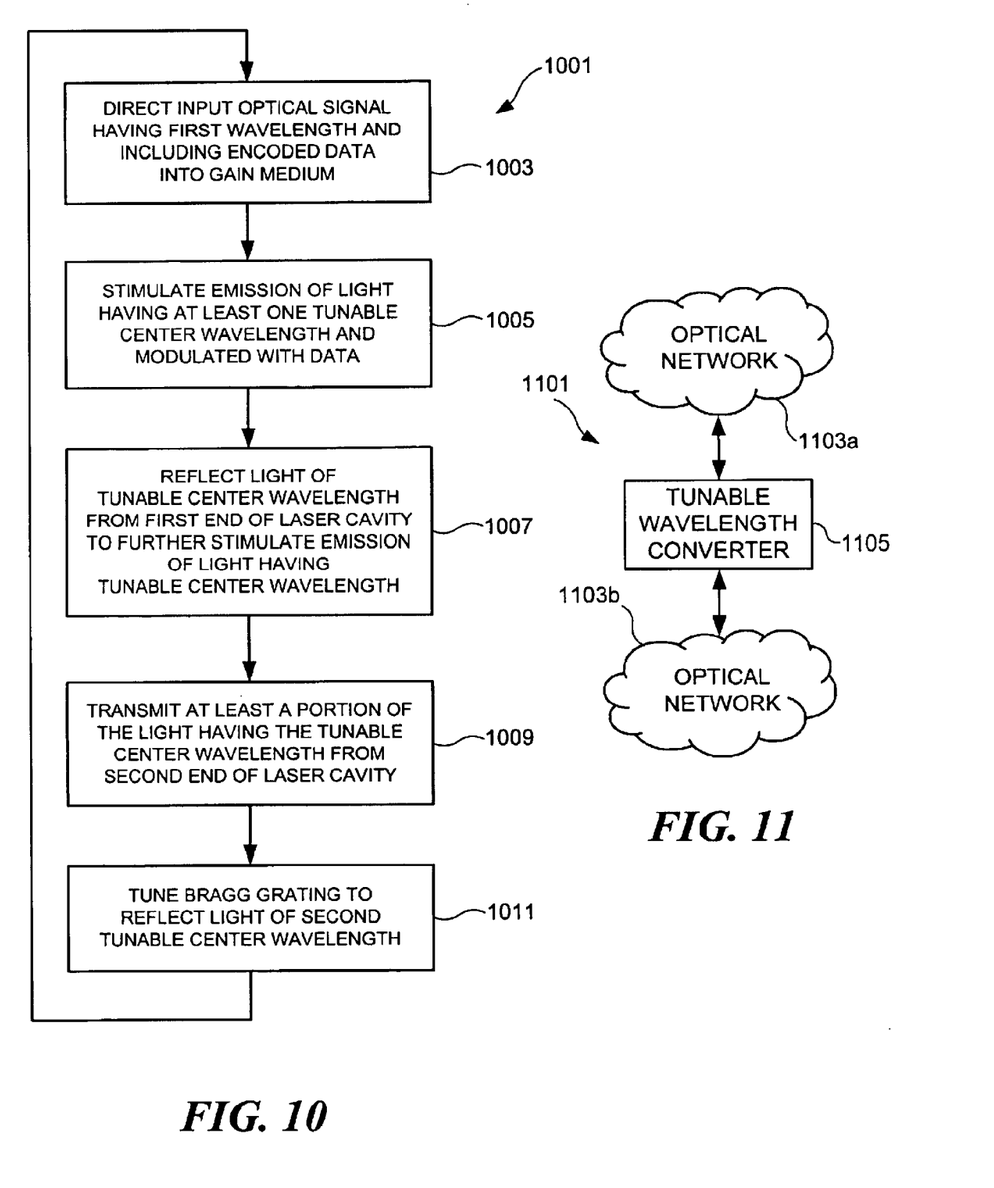
FIG. 10 is a flow diagram illustrating an example flow of events in a process for utilizing a tunable wavelength converter in accordance with an embodiment of the present invention.
FIG. 11 is a block diagram illustrating an example optical system in accordance with an embodiment of the present invention.

With reference now primarily to FIG. 10, a flow diagram illustrating an example flow of events in a process 1001 for tunable wavelength conversion using a tunable Bragg grating and a laser in a semiconductor substrate is shown in accordance with an embodiment of the present invention. As described previously in conjunction with FIGS. 1–9, the process 1001 begins with the direction of an input optical signal having a first wavelength and including encoded data into a gain medium (see, e.g., process block 1003). The process 1001 then continues with the stimulated emission of light from the gain medium having at least one tunable center wavelength distinct from the first wavelength, and being modulated with the data (see, e.g., process block 1005). Following this, the process 1001 continues with the reflection of light of the tunable center wavelength from a first end (e.g., a tunable Bragg grating) of a laser cavity to further stimulate emission of light having the tunable center wavelength (see, e.g., process block 1007). The process 1001 then proceeds with the transmission of at least a portion of the light having the tunable center wavelength from a second end of the laser cavity (see, e.g., process block 1009).

In one embodiment, the process 1001 next proceeds with the tuning of the Bragg grating to reflect light of a second tunable center wavelength (see, e.g., process block 1011) to allow the tunable wavelength converter of embodiments of the present invention to convert the input optical signal, or another input optical signal, into another different wavelength.

With reference now primarily to FIG. 11, a block diagram illustrating an example optical system 1101 is shown in accordance with an embodiment of the present invention. In one embodiment, the optical system 1101 includes an optical communication network 1103a optically coupled to a tunable wavelength converter 1105. The tunable wavelength converter 1105 may be optically coupled to the optical communication network 1103 via, for example, a fiber ribbon, or the like, in an embodiment. It will be appreciated that the tunable wavelength converter 1105 may comprise any and/or all of the embodiments described above in conjunction with FIGS. 1–9.

In one embodiment, the tunable wavelength converter 1105 may be optically coupled to another optical network 1103b, which may comprise a network separate from the first optical network 1103a, or may simply comprise another part of a larger network. For example, the tunable wavelength converter 1105 may function as an interconnection between portions of an optical network (e.g., optical networks 1103a and 1103b) to convert information/data from one wavelength (i.e., channel) to another wavelength to improve the efficiency of communication via the optical network.

While the invention is described and illustrated here in the context of a limited number of embodiments, the invention may be embodied in many forms without departing from the spirit of the essential characteristics of the invention. The illustrated and described embodiments, including what is described in the abstract of the disclosure, are therefore to be considered in all respects as illustrative and not restrictive. The scope of the invention is indicated by the appended claims rather than by the foregoing description, and all changes that come within the meaning and range of equivalency of the claims are intended to be embraced therein.

What is claimed is:

1. An apparatus, comprising:
   a gain medium disposed in a semiconductor substrate, the gain medium to receive an input optical signal having a first wavelength and including data encoded therein;
   a laser cavity disposed in the semiconductor substrate, the laser cavity optically coupled to the gain medium;
   a first reflector defining a first end of the laser cavity, the first reflector including a tunable Bragg grating disposed in the semiconductor substrate, the tunable Bragg grating including a plurality of interfaces along the semiconductor substrate to form a plurality of perturbations of a refractive index along the tunable Bragg grating to selectively reflect light having a tunable center wavelength distinct from the first wavelength to cause stimulated emission of light having the tunable center wavelength in the laser cavity, the light having the tunable center wavelength corresponding to an emission generated by the gain medium and modulated with the data in response to an interaction with the input optical signal; and
   a second reflector defining a second end of the laser cavity, the second reflector capable to at least partially transmit the light having the tunable center wavelength.

2. The apparatus of claim 1, wherein the emission generated by the gain medium comprises light of the tunable center wavelength having an intensity proportionate to an intensity of the input optical signal.

3. The apparatus of claim 1, further comprising a heater disposed proximate to the semiconductor substrate including the tunable Bragg grating, the semiconductor substrate including the tunable Bragg grating having a temperature responsive to the heater, the tunable center wavelength being responsive to the temperature of the semiconductor substrate.

4. The apparatus of claim 1, wherein the laser cavity comprises a rib waveguide disposed in the semiconductor substrate.

5. The apparatus of claim 1, wherein the plurality of interfaces comprise a plurality interfaces between silicon and polysilicon regions.

6. The apparatus of claim 1, wherein the plurality of interfaces comprise a plurality of interfaces between charge modulated regions.

7. The apparatus of claim 6, wherein a charge concentration in the charge modulated regions is adjusted in response to a modulation signal, the tunable center wavelength being responsive to the charge concentration in the charge modulated regions.

8. The apparatus of claim 1, wherein the plurality of interfaces comprise a plurality of interfaces between regions of varying thickness.

9. The apparatus of claim 1, wherein the gain medium comprises a quantum cascade intersubband laser.

10. The apparatus of claim 9, wherein the quantum cascade intersubband laser includes multiple quantum wells, the multiple quantum wells comprising materials to emit light within a range of from approximately 1500 nm to approximately 1600 nm in response to intersubband transitions.

11. The apparatus of claim 10, wherein the materials comprise at least one of a combination of AlGaN/GaN or a combination of InGaAs/AlAsSb.

12. The apparatus of claim 1, wherein the tunable Bragg grating comprises one of a first plurality of tunable Bragg gratings disposed in the semiconductor substrate cascaded along the laser cavity, each of the first plurality of tunable Bragg gratings having different tunable center wavelengths and defining the first end of the laser cavity at their respective different tunable center wavelengths.

13. The apparatus of claim 1, wherein the second reflector includes a second Bragg grating disposed in the semiconductor substrate to form a second plurality of perturbations of a refractive index along the second tunable Bragg grating, the second tunable Bragg grating to selectively reflect light having the tunable center wavelength to cause stimulated emission of light having the tunable center wavelength in the laser cavity.

14. A method, comprising:
directing an input optical signal having a first wavelength and including data encoded therein into a gain medium disposed in a semiconductor substrate to stimulate emission of light from the gain medium in a laser cavity disposed in the semiconductor substrate, the emitted light having at least one tunable center wavelength distinct from the first wavelength and including the data modulated therewith;
reflecting the light having the tunable center wavelength from a first end of the laser cavity to further stimulate emission of light having the tunable center wavelength in the laser cavity, the light having the tunable center wavelength being reflected from the first end of the laser cavity by a tunable Bragg grating including a plurality of interfaces along the semiconductor substrate to form a plurality of perturbations of a refractive index along the tunable Bragg grating; and
transmitting at least a portion of the light having the tunable center wavelength from a second end of the laser cavity.

15. The method of claim 14, further comprising, tuning the tunable Bragg grating to selectively reflect light having a second tunable center wavelength.

16. The method of claim 15, wherein tuning the tunable Bragg grating comprises adjusting a temperature of the semiconductor substrate including the tunable Bragg grating with a heater disposed proximate to the semiconductor substrate including the tunable Bragg grating.

17. The method of claim 15, wherein tuning the tunable Bragg grating comprises modulating a charge concentration in a plurality of charge modulated regions, the plurality of charge modulated regions forming the plurality of interfaces along the semiconductor substrate.

18. The method of claim 14, wherein directing the input optical signal having the first wavelength and including data encoded therein into the gain medium comprises receiving an optical communication signal from an optical communication network.

19. The method of claim 14, wherein transmitting the at least a portion of the light having the tunable center wavelength comprises transmitting an optical communication signal on an optical communication network.

20. A system, comprising:
an optical communication network; and
a tunable wavelength converter, optically coupled to the optical communication network, the tunable wavelength converter comprising,
a gain medium disposed in a semiconductor substrate, the gain medium to receive an input optical signal having a first wavelength and including data encoded therein,
a laser cavity disposed in the semiconductor substrate, the laser cavity optically coupled to the gain medium,
a first reflector defining a first end of the laser cavity, the first reflector including a tunable Bragg grating disposed in the semiconductor substrate, the tunable Bragg grating including a plurality of interfaces along the semiconductor substrate to form a plurality of perturbations of a refractive index along the tunable Bragg grating to selectively reflect light having a tunable center wavelength distinct from the first wavelength to cause stimulated emission of light having the tunable center wavelength in the laser cavity, the light having the tunable center wavelength corresponding to an emission generated by the gain medium and modulated with the data in response to an interaction with the input optical signal, and
a second reflector defining a second end of the laser cavity, the second reflector capable to at least partially transmit the light having the tunable center wavelength.

21. The system of claim 20, wherein the tunable wavelength converter further comprises a heater disposed proximate to the semiconductor substrate including the tunable Bragg grating, the semiconductor substrate including the tunable Bragg grating having a temperature responsive to the heater, the tunable center wavelength being responsive to the temperature of the semiconductor substrate.

22. The system of claim 20, wherein the laser cavity comprises a rib waveguide disposed in the semiconductor substrate.

23. The system of claim 20, wherein the plurality of interfaces comprise a plurality interfaces between silicon and polysilicon regions.

24. The system of claim 20, wherein the plurality of interfaces comprise a plurality of interfaces between charge modulated regions.

25. The system of claim 24, wherein a charge concentration in the charge modulated regions is adjusted in response to a modulation signal, the tunable center wavelength being responsive to the charge concentration in the charge modulated regions.

26. The system of claim 20, wherein the plurality of interfaces comprise a plurality of interfaces between regions of varying thickness.

27. The system of claim 20, wherein the gain medium comprises a quantum cascade intersubband laser.

28. The system of claim 27, wherein the quantum cascade intersubband laser includes multiple quantum wells, the multiple quantum wells comprising materials capable to emit light within a range of from about 1500 nm to about 1600 nm in response to intersubband transitions.

29. The system of claim 20, wherein the tunable Bragg grating comprises one of a first plurality of tunable Bragg gratings disposed in the semiconductor substrate cascaded along the laser cavity, each of the first plurality of tunable Bragg gratings having different tunable center wavelengths and defining the first end of the laser cavity at their respective different tunable center wavelengths.

30. The system of claim 20, wherein the second reflector includes a second Bragg grating disposed in the semiconductor substrate to form a second plurality of perturbations of a refractive index along the second tunable Bragg grating, the second tunable Bragg grating to selectively reflect light having the tunable center wavelength to cause stimulated emission of light having the tunable center wavelength in the laser cavity.

* * * * *

UNITED STATES PATENT AND TRADEMARK OFFICE
CERTIFICATE OF CORRECTION

PATENT NO.    : 6,788,727 B2
DATED         : September 7, 2004
INVENTOR(S)   : Liu, Ansheng It is certified that error appears in the above-identified patent and that said Letters Patent is hereby corrected as shown below:

Column 13,
Line 31, delete "GI" and insert -- G1 --.

Signed and Sealed this

Seventh Day of June, 2005

JON W. DUDAS
*Director of the United States Patent and Trademark Office*